United States Patent [19]

Giolma et al.

[11] Patent Number: 4,498,020
[45] Date of Patent: Feb. 5, 1985

[54] CURRENT TO FREQUENCY CONVERTER

[75] Inventors: William H. Giolma; John D. Morgan, both of Dallas, Tex.

[73] Assignee: Texas Instruments Incorporated, Dallas, Tex.

[21] Appl. No.: 312,441

[22] Filed: Oct. 19, 1981

[51] Int. Cl.³ .......................... H03K 3/01; H03K 5/24
[52] U.S. Cl. .................................... 307/261; 307/271; 307/311; 307/362; 328/128; 328/151
[58] Field of Search ............... 307/228, 271, 350, 354, 307/359, 360, 311, 261, 362; 328/127, 128, 151, 181, 150

[56] References Cited

U.S. PATENT DOCUMENTS

| | | | |
|---|---|---|---|
| 3,449,695 | 6/1969 | Marsh | 307/271 |
| 3,921,012 | 11/1975 | Marshall | 307/271 |
| 3,968,447 | 7/1976 | Baylac et al. | 328/151 |
| 4,109,168 | 8/1978 | Raymond | 307/271 |

*Primary Examiner*—John Zazworsky
*Attorney, Agent, or Firm*—Thomas W. Demond; N. Rhys Merrett; Melvin Sharp

[57] ABSTRACT

A current to frequency converter having an operational amplifier with two inputs, an output, and a feedback capacitor connected between one input and the output to produce an output voltage waveform having a rate of change proportional to the input current between a first and second predetermined voltages. A level detector and active switching devices to detect the second predetermined voltage level and reset the voltage level of the waveform to the first predetermined voltage level. The level detector produces an output signal when the second voltage level is reached. The output signals form a digital pulse stream having a frequency proportional to the input current.

10 Claims, 3 Drawing Figures

CURRENT TO FREQUENCY CONVERTER

BACKGROUND OF THE INVENTION

1. Field of the Invention

This invention relates to a current to frequency converter having an operational amplifier and level detector therein, and more particularly, this invention relates to a current to frequency converter having an operational amplifier which has its non-inverting input connected to a constant voltage and its output disabled when a level detector, which is connected to the output of the operational amplifier, detects a predetermined voltage level until the output of the operational amplifier reaches a second predetermined voltage level.

2. Description of the Prior Art

The voltage to frequency converter generally known as VFC32 produced by Burr-Brown has a resistor between its voltage input and the negative input of its operational amplifier. Also connected to the negative input of the operational amplifier is a capacitor, which has its other opposite side connected to the output of the operational amplifier. The negative input of the operational amplifier is also connected to a constant current sink through switch. The switch which is normally open is capable of selectively providing an open circuit or alternately actuating the constant current sink. The output of the operational amplifier is connected to the negative input of a comparator. The positive input of the comparator is connected to ground, as is the positive input of the operational amplifier. The output of the comparator is connected to the input of a one-shot device. The output of the one-shot device is connected in a manner to close the switch when the one-shot device is actuated and through a transistor to provide a pulse of known duration when the output of the comparator indicates that the output of the operational amplifier is at ground or close thereto. In operation, when the switch is closed, the output of the operational amplifier increases to a predetermined value. The switch is then opened and the output of the operational amplifier responding to the voltage applied to the input to the voltage to frequency converter reduces from the predetermined value at a rate proportional to the voltage level at the input. When the voltage level is close to zero, the comparator so indicates to the one-shot device which produces a pulse which in turn closes the switch to ground. The constant current sink, which is attached to the negative input of the amplifier, causes the output of the input amplifier to increase until it reaches the predetermined value. Thus, the frequency of the pulses produced at the output of the one-shot device is proportional to the voltage level present at the input to the voltage to frequency converter.

SUMMARY OF THE INVENTION

The current to frequency converter of the present invention receives the current at its input terminal. The input terminal of the current to frequency converter is connected to the negative input of an operational amplifier therein. The positive input to the operational amplifier is connected to ground (or alternatively a low impedance bias voltage). The output of the operational amplifier is connected to one side of a feedback capacitor which has its other side connected to the negative input of the operational amplifier. The output of the operational amplifier is also connected to a level detector. The level detector supplies an output signal when the output of the operational amplifier reaches a first predetermined voltage level and discontinues producing its output signal when the output of the operational amplifier reaches a second predetermined voltage level. The output of the level detector is connected to first and second switches and to a one-shot device. The output of the one-shot device is connected to an output terminal which can be the output of the current to frequency converter. The output signal from the level detector causes the first and second switches to go from the open position to a closed position. In the closed position, the first switch connects the negative input of the operational amplifier to the positive input. While in the closed position, the second switch alters the energy on the feedback capacitor. In the open position, the first and second switches provide an open circuit. The output of the one-shot device to the output terminal is a digital pulse stream which has a frequency directly proportional to the magnitude of the current applied to the input terminal of the current to frequency converter. The input to the current to frequency converter can be, for example, a photodiode, although any source of current can be utilized. When the first and second switches are closed, energy is drained from the feedback capacitor connected between the input and output of the operational amplifier, thus rapidly reducing the voltage level at the output of the operational amplifier, while maintaining the inverting input to the operational amplifier at essentially the non-inverting input level.

It is an advantage of the present invention to provide a current to frequency converter which provides a digital pulse stream at its output having a frequency which is proportional to the magnitude of the current at the input of the operational amplifier.

It is also an advantage of the present invention to provide a current to frequency converter which is responsive to a current input of relatively small magnitudes.

A further advantage of the present invention is to provide a current to frequency converter which is capable of producing an accurate frequency over a dynamic range of greater than 1 to 5,000 variation of the input current.

It is another advantage of the present invention to provide a current to frequency converter which is capable of operation with a capacitor parallel to the source of input current.

It is an advantage of the present invention to provide a current to frequency converter which utilizes a single supply voltage and ground.

It is also an advantage of the present invention to provide a current to frequency converter which utilizes a low cost operational amplifier.

Another advantage of the present invention is to provide a current to frequency converter which rapidly responds to changes in the magnitude of the input current.

An additional advantage of the present invention is to provide a circuit having an operational amplifier whose inverting input is switched to the non-inverting input and whose output is disabled, allowing the feedback capacitor to discharge.

DESCRIPTION OF THE PREFERRED EMBODIMENT

Figure 1:
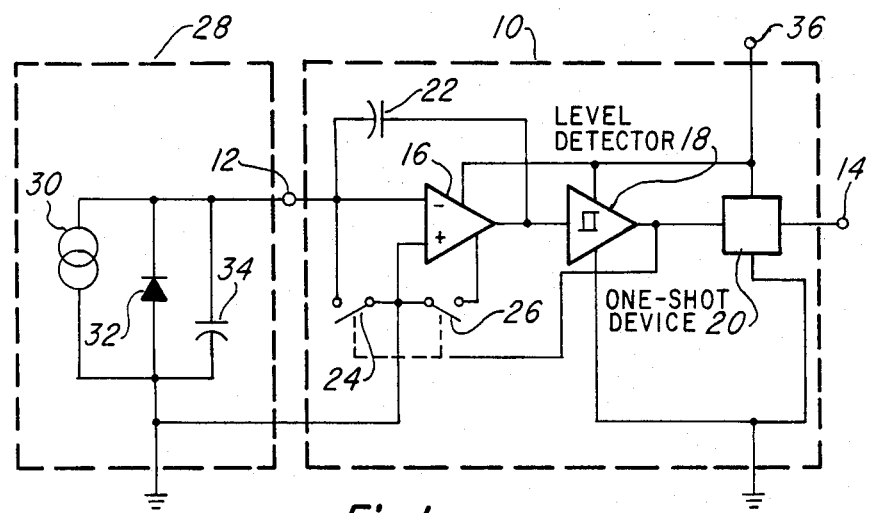
FIG. 1 is a block diagram of a current to frequency converter constructed according to the present invention.

With reference to the drawings and in particular to FIG. 1 thereof, a current to frequency converter 10 is shown having an input terminal 12 and an output terminal 14. The current to frequency converter also includes an operational amplifier 16, a level detector 18, a one-shot device 20, a feedback capacitor 22, switch 24, and switch 26.

A photodiode 28 is connected at one end to input terminal 12 and at its other opposite end to ground. Photo diode 28 is represented in FIG. 1 as a current source 30, a diode 32, and a capacitor 34. When light impinges on the surface of the photodiode 28, the current source 30 produces a current flow. The greater the amount of light energy falling onto the surface of the photodiode, the greater the current produced by current source 30. The cathode of diode 32 is connected to terminal 12 and its anode to ground. Capacitor 34 is connected at one side to terminal 12 and at its other opposite side to ground. Capacitor 34 represents the parasitic capacitance of the photodiode. The current flow produced by the current source 30 is directed from the input terminal 12 to ground. Input terminal 12 is connected to the negative (inverting) input of operaional amplifier 16 to one side of capacitor 22 and to a contact of switch 24. The positive (noninverting) input of operational amplifier 16 is connected to ground. The side of capacitor 22 away from its connection to input terminal 12 is connected to the output of operational amplifier 16. The output of operational amplifier 16 is connected as an input to level detector 18. Level detector 18 senses the voltage level at the output of operational amplifier 16 and issues an output signal when the output of operational amplifier 16 reaches a first predetermined voltage level. The level detector 18 continues to produce the output signal until the output of operational amplifier 16 reaches a second predetermined voltage level. The output of the level detector in the preferred embodiment produces a high voltage level relative to ground as its output signal. This high output signal is connected to one-shot device 20 which is utilized as a pulse shaper and is also connected to actuate switches 24 and 26. If the pulses produced by the level detector 18 are of sufficient width for the remainder of the circuitry, the one-shot device 20 can be omitted with the output signals of the level detector 18 forming the digital pulse stream connected to output terminal 14. The high output signal from level detector 18 causes switches 24 and 26 to move from an open to closed position.

One contact of switch 24 is connected to input terminal 12 as discussed above and its other contact is connected to ground. When the switch closes, input terminal 12 is connected to ground. One contact of switch 26 is also connected to ground and the other contact is connected to the output circuit of operational amplifier 16. When the output of level detector 18 produces its output signal, switches 24 and 26 move from their normally open position to the closed position to connect the input terminal 12 to ground. The output of operational amplifier 16 is disabled when switch 26 is closed and the energy on capacitor 22 is altered.

When level detector 18 produces its output signal, the one-shot device 20 responds thereto by producing a pulse of known duration. The known duration is sufficient to be detected by other devices (not shown) to which the output is connected. However, the pulses produced by one-shot 20 are of a duration so that the pulses do not overlap at the highest frequency of the pulses produced by the level detector 18. Further, the one-shot device 20 should be allowed a sufficient time interval between producing a pulse in response to the last output signal from level detector 18 to recover therefrom and the receipt of the next output signal from level detector 18. As shown in FIG. 1, two separate grounds are provided, one to the photo detector and operational amplifier, and another to the level detector and one-shot device. It has been found useful to provide separate analog and digital grounds. It has also been found useful for operational amplifier 16 to have an input offset voltage close to zero. A power supply source (not shown) is connected to terminal 36 for supplying power to operational amplifier 16, level detector 18, and one-shot device 20.

Figure 2:
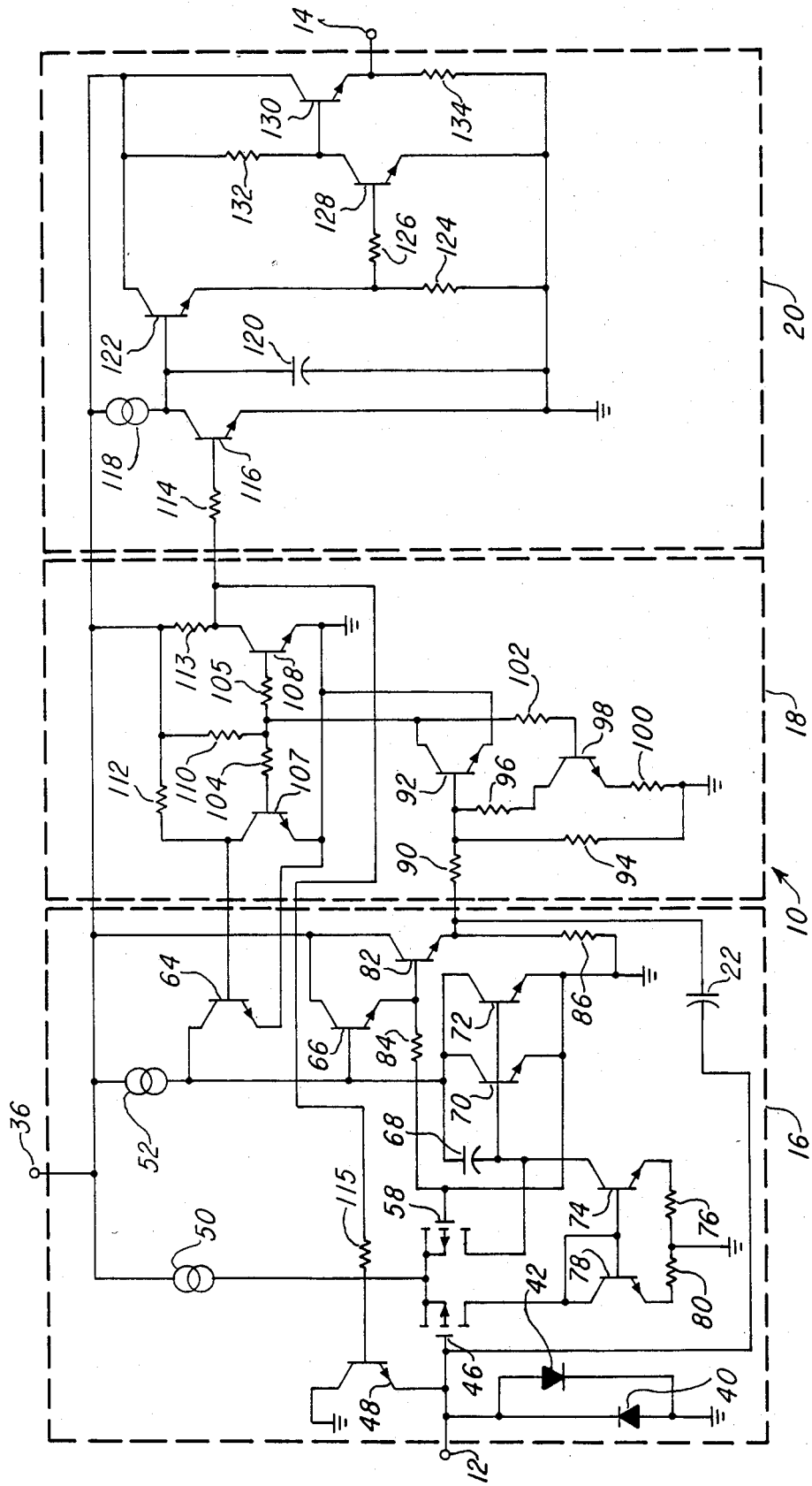
FIG. 2 is a detailed schematic of a circuit embodying the current to frequency converter of the present invention.

FIG. 2 shows a more detailed representation of the current to frequency converter 10 shown in FIG. 1, although certain slight modifications are present. Terminal 12 is connected to the cathode of diode 40, the anode of diode 42, the gate of FET 46, and the emitter of NPN transistor 48. Transistor 48 performs the function of switch 24 in FIG. 1. The anode of diode 40 and the cathode of diode 42 are connected to ground. Diodes 40 and 42 serve to prevent damage to FET 46 from improper input voltages. The current source 50 is connected to the source of FETs 46 and 58. The current source 52 is connected to the collector of NPN transistor 64, the base of NPN transistor 66, one side of capacitor 68, and the collectors of NPN transistors 70 and 72. The collector of transistor 48 is connected to ground. Terminal 36, which is connected to a power source (not shown), is connected to constant current sources 50 and 52. The emitters of transistors 70 and 72 and the gate of FET 58 are connected to ground. The other side of compensation capacitor 68 is connected to the bases of transistor 70 and 72 and to the collector of NPN transistor 74. The drain of FET 58 is also connected to the collector of transistor 74. The emitter of transistor 74 is connected through a resistor 76 to ground. The base of transistor 74 is connected to the base of NPN transistor 78 and to the drain of FET 46. The emitter of transistor 78 is connected through a resistor 80 to ground.

The collector of transistor 66 is connected to terminal 36 and the emitter thereof is connected to the base of an NPN transistor 82 and through a resistor 84 to ground. Transistor 82 has its collector connected to terminal 36 and its emitter connected through a resistor 86 to ground. The emitter of transistor 82 is also connected to the input of level detector 18 and comprises the amplified output of operational amplifier 16. Transistor 64 comprises the switch 26 shown in FIG. 1. The emitter of transistor 64 is connected to ground. Capacitor 22 is connected between the emitter of transistor 82 and the input terminal 12.

Level detector 18 receives the output of the emitter of transistor 82 within operational amplifier 16 through a resistor 90 at the base of an NPN transistor 92. The base of transistor 92 is also connected through a resistor 94 to ground and through a resistor 96 to the collector of an NPN transistor 98. The emitter of transistor 98 is connected through a resistor 100 to ground. The base of transistor 98 is connected through a resistor 102 to the collector of transistor 92. The emitter of transistor 92 is connected to ground. The collector of transistor 92 is also connected through resistors 104 and 105 to the bases of NPN transistors 107 and 108, respectively. The collector of transistor 92 is also connected through a resistor 110 to terminal 36. The collector of transistor 107 is connected through a resistor 112 to terminal 36 and the emitter of transistor 107 is connected to ground. The collector of transistor 107 is also connected to the base of transistor 64. The emitter of transistor 108 is connected to ground and its collector is connected through resistor 113 to terminal 36, to resistor 114 of one-shot device 20 and to the base to transistor 48 through resistor 115. The output from the collector of transistor 108 to resistor 114 is the output of level detector 18.

Within one-shot device 20, resistor 114 is connected to the base of NPN transistor 116. The collector of transistor 116 is connected through a constant current source 118 to terminal 36, one side of a capacitor 120, and the base of an NPN transistor 122. The emitter of transistor 116 is connected to ground. Transistor 122 has its collector connected to terminal 36 and its emitter connected through resistor 124 to ground and through resistor 126 to the base of NPN transistor 128. The other side of capacitor 120 is connected to ground. The emitter of transistor 128 is connected to ground and its collector is connected to the base of NPN transistor 130 and through a resistor 132 to terminal 36. Transistor 130 has its collector connected to terminal 36 and its emitter connected to output terminal 14 of current to frequency converter 10 and through a resistor 134 to ground.

If transistors 48 and 64 are conducting, the current present at input terminal 12 is shunted to ground through transistor 48 and the energy present on capacitor 22 is shunted through resistor 86, etc. to ground. Transistor 64 maintains the base of transistor 66 at essentially ground. Thus, the output of the operational amplifier 16 is effectively disabled and is pulled toward ground by the resistor loads 86, etc. and its input is switched to ground. This provides nearly zero biasing at the gates of PMOS FETs 46 and 58.

When transistors 48 and 64 are switched off, the current present on terminal 12 caused FET 46 to increase conduction which applies a more positive voltage to the base of transistor 74. The increased current flow through FET 58 decreases the voltage level present on the base of transistor 70 and 72. The decreased voltage levels at the bases of transistors 70 and 72 is inverted by transistors 70 and 72, which increases the voltage level at the base of transistor 66. This voltage is applied to the base of transistor 66 which increases the voltage on the base of transistor 82. The increased voltage level applied to the base of transistor 82 causes an increased voltage output to the level detector 18. The described operational amplifier along with the capacitor 22 forms an integrator circuit whose output is proportional to the time integral of the input current. Thus, the output of transistor 82 to level detector 18 is approximately a ramp which has a slope proportional to the magnitude of the current level present at input terminal 12 and the value of capacitor 22. In other words, the rate of change of the voltage level of the output from the operational amplifier is proportional to the magnitude of the current at the input terminal 12 and the value of capacitor 22.

The higher voltage produced at the output of transistor 82 is applied after voltage dropped across resistor 90 to the base of transistor 92. When the voltage level increases sufficiently to turn on transistor 92, this pulls the base of transistor 98 low. Transistor 98, which is ordinarily on, turns off which increases the drive current to the base of transistor 92. At the same time, it causes the bases of transistors 107 and 108 to go low which in turn switches these transistors off. This applies a high signal to the bases of transistors 48 and 64 which causes these transistors to turn on. In the on state, transistor 48 connects input terminal 12 to ground and transistor 64 connects the base of transistor 66 to ground. Thus, the output of operational amplifier 16 is disabled and a portion of the stored energy on capacitor 22 is removed through resistor 86 etc. As the voltage level at the output of operational amplifier 16 goes rapidly down, at some point it reaches a second predetermined voltage level which is lower than the first predetermined voltage level which causes transistor 92 to turn off and switches transistor 98 on again. The transistors 107 and 108 also turn on, which applies ground to the bases of transistors 48 and 64 which in turn causes these transistors to switch off. The time period for the output of the operational amplifier 16 to reduce to the second predetermined voltage level from the first predetermined voltage level is extremely small when compared to the time for the output of the operational amplifier to ramp from the second predetermined voltage level to the first predetermined voltage level. The first and second voltage levels can be, for example, 1.1 volts to 1.4 volts. This type of range has been found useful in preventing saturation of the operational amplifier which can occur when rapidly reducing the output voltage.

The short output signal at the output of level detector 18 to resistor 114 from the collector of transistor 108 is an input to the base of transistor 116 within one-shot device 20. Transistor 116 turns on which causes the voltage level at its collector to go to close to ground. The low voltage level causes transistor 122 to switch off. When transistor 122 switches off, the voltage level at the base of transistor 128 goes low, which causes transistor 128 to switch off. When transistor 128 switches off, a high voltage level is applied to the base of transistor 130 to switch it on, thus applying a high voltage level at the output terminal 14. When the transistor 108 switches on again within relatively short time period which causes transistor 116 to switch off, capacitor 120 begins to be charged by current source 118. The capacitor thus maintains the base of transistor 122 at a relatively low voltage level for a certain amount of time determined by the value of capacitor 120 and current source 118. When the transistor 122 switches on again, it turns on transistor 128 which turns off transistor 130. When transistor 130 is off, a low voltage level is provided as the output to output terminal 14. Thus, the one-shot device 20 applies an output pulse which has a significantly longer duration than the output pulse of the level detector 18. For example, the output waveform of the level detector 18 could have a pulse on the order of 100 (nsec) and the output of the shaped pulse by the one-shot device 20 could have a duration on the order of 2 $\mu$sec. The dynamic range of the current to frequency converter 10 is from its lowest to highest frequency sufficient to accurately respond to changes in the input current from its lowest value to at least 5000 times that value. The lowest frequency of the converter is generally about 50 Hz, with the highest about 250 KHz. The current from the photo diode 28 generally ranges between 1 NA to 5 μA.

Figure 3:
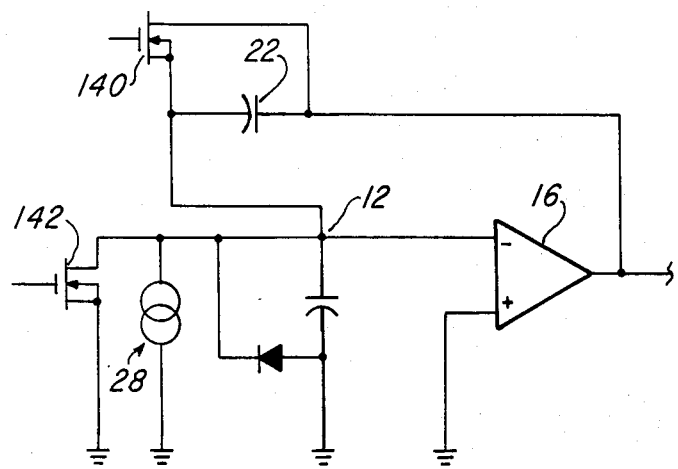
FIG. 3 shows another arrangement of the switches located at the input and output of the operational amplifier of FIG. 1.

Another embodiment for the arrangement of the switches 24 and 26 of FIG. 1 is shown in FIG. 3 In FIG. 3, an FET 140 is connected to receive the output pulse from level detector 18 (FIG. 1). Another FET 142 also has the output of level detector 18 connected to its gate. The source and drain FET 142 are connected between the input terminal 18 and ground. Thus, when FET 142 is turned on, the input terminal 12 is connected to ground. The source and drain of FET 140 are connected across capacitor 22. When FET 140 is turned on by the output pulse from level detector 18, the capacitor 22 is shunted. Both sides of the capacitor are then also connected to ground through FETs 140 and 142.

In operation, the current present at the input terminal 12 is applied to the negative input of operational amplifier 16. The output of operational amplifier 16 is applied to the level detector 18 and to capacitor 22. The output of operational amplifier 16 has ramps from one predetermined voltage level to another predetermined voltage level. Those voltage levels are determined by the level detector 18. The greater the current applied to the input terminal, the greater the slope of the output of operational amplifier 16. The greater the slope of the output voltage of operational amplifier 16 (or the greater its rate of change), the faster the output goes from the one predetermined voltage level to another. When the magnitude of the output voltage of operational amplifier 16 reaches the higher predetermined voltage level, the level detector 18 applies an output pulse to switches 24 and 26 and to one-shot device 20. The one-shot device 20 produces an output pulse of known duration to output terminal 14. Switches 24 and 26 close and connect the input terminal 12 to ground and alter the energy on capacitor 22, respectively. This removes energy from the feedback capacitor 22 until the output of the operational amplifier reaches the other predetermined voltage level at which time the level detector 18 turns off its pulse, thus opening the switches 24 and 26 and the output of the operational amplifier begins to ramp from one voltage level to another voltage level again.

The pulses from the one-shot device 20 form a digital pulse stream.

The rate of change of the voltage level at the output of the operational amplifier is described by the following formula:

$$(dv/dt) = I/C$$

Where, dv is the voltage level change, dt is the time interval, I is the input current and C is the value of feedback capacitor. The frequency is proportional to the inverse of DT.

Therefore, the frequency of the digital pulse stream produced is proportional to the magnitude of the input current.

Whereas the present invention has been described in particular relation to the drawings attached hereto, it should be understood that other and further modifications, apart from those shown or suggested herein, may be made within the spirit and scope of this invention.

What is claimed is:

1. A current to frequency converter having an input terminal with an input current applied thereto, comprising:
   (a) a first means having first and second inputs and an output, with said first input connected to said input terminal and with said second input connected to a constant voltage level and a feedback capacitor connected between said first input and said output for producing an output voltage level having a rate of change from a first to a second predetermined voltage level proportional to the magnitude of said input current;
   (b) a second means for selectively connecting said input terminal to said constant voltage level in response to an output signal;
   (c) a third means for selectively altering the energy on said feedback capacitor to change the said output voltage level at said output from said second predetermined voltage level to said first predetermined voltage level in response to said output signal; and
   (d) a fourth means connected to said output to provide said output signal when said output voltage level is at said second predetermined voltage level until said output voltage level is at said first predetermined voltage level for producing a plurality of output signals at a frequency proportional to the magnitude of said input current.

2. A current to frequency converter having an input terminal for receiving a current applied thereto, comprising:
   (a) an operational amplifier having two inputs and an output with one input operatively connected to said input terminal and another input connected to a constant voltage level, and an integrating capacitor connected to said output and to said input terminals;
   (b) a level detector connected to said output of said operational amplifier to produce an output signal when the voltage level of said output reaches a first predetermined voltage level until the voltage level of said output reaches a second predetermined voltage level;
   (c) a first switch connected to receive said output signal and responding thereto by connecting said one input of said operational amplifier to said constant voltage level;
   (d) a second switch connected to receive said output signal and responding thereto by altering the stored energy on said integrating capacitor; and
   (e) pulse shaping means connected to receive said output signal to produce a pulse of known duration in response thereto.

3. A current to frequency converter as set forth in claim 2 wherein said second switch disables the output of said operational amplifier in response to said output signal.

4. A current to frequency converter as set forth in claim 3 wherein said second switch connects one side of said capacitor to another side of said capacitor in response to said output signal.

5. A current to frequency converter as set forth in claim 4 including a photodiode connected to said input terminal for supplying said input current thereto.

6. A current to frequency converter having an input terminal receiving an input current applied thereto comprising:

(a) an operational amplifier having an inverting input, a non-inverting input, and an output with a feedback capacitor connected between said output and said inverting input, said operational amplifier connected at said non-inverting input to a constant voltage level and at said inverting input to said input terminal for producing a voltage level at said output having a rate of change proportional to the magnitude of said input current from a first to a second predetermined voltage level, said first and second predetermined voltage levels having magnitudes between ground and a supply voltage level;

(b) a first active switching device for selectively connecting said inverting input to said constant voltage level in response to an output signal;

(c) a second active switching device for selectively altering the energy on said feedback capacitor in response to said output signal to change the voltage level of said output from said second predetermined voltage level to first predetermined voltage level; and (d) a level detector connecting to said output, said first device, and said second device, for producing said output signal when the voltage level at said output is at second predetermined voltage level until said first and second devices alter the voltage level at said output to said first predetermined voltage level, said level detector producing output signals at a frequency proportional to the magnitude of said input current.

7. Current to frequency converter as set forth in claim 6 including a pulse shaper connected to receive said output signal to produce a pulse of known duration in response thereto.

8. Current to frequency converter as set forth in claim 6 wherein said second device disables said output in response to said output signal.

9. Current to frequency converter as set forth in claim 6 wherein said second device connects one side of said capacitor to another side of said capacitor in response to said output signal.

10. A current to frequency converter as set forth in claim 6 including a photodiode connected to said input terminal for supplying said input current thereto.

* * * * *